US008103982B2

(12) United States Patent
Scheffer

(10) Patent No.: US 8,103,982 B2
(45) Date of Patent: Jan. 24, 2012

(54) SYSTEM AND METHOD FOR STATISTICAL DESIGN RULE CHECKING

(75) Inventor: Louis K. Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 157 days.

(21) Appl. No.: 11/437,600

(22) Filed: May 19, 2006

(65) Prior Publication Data

US 2006/0265674 A1 Nov. 23, 2006

Related U.S. Application Data

(60) Provisional application No. 60/683,438, filed on May 20, 2005.

(51) Int. Cl.
*G06F 17/50* (2006.01)
(52) U.S. Cl. ............... 716/52; 716/51; 716/53; 716/54; 716/55; 716/56
(58) Field of Classification Search ............... 716/2, 18, 716/19–21, 4–6, 51–56; 703/13–14
See application file for complete search history.

(56) References Cited

U.S. PATENT DOCUMENTS

| | | | |
|---|---|---|---|
| 5,539,652 A | | 7/1996 | Tegethoff |
| 6,298,470 B1* | | 10/2001 | Breiner et al. ................ 716/4 |
| 6,507,930 B1* | | 1/2003 | Bass et al. .................... 716/2 |
| 6,775,806 B2* | | 8/2004 | Li ................................. 716/1 |
| 6,907,369 B1* | | 6/2005 | Markle et al. ................ 702/81 |
| 7,076,749 B2* | | 7/2006 | Kemerer et al. .............. 716/4 |
| 7,185,311 B2* | | 2/2007 | Inoue ........................... 716/19 |
| 7,194,725 B1* | | 3/2007 | Lukanc et al. ............... 716/19 |
| 2003/0237064 A1* | | 12/2003 | White et al. .................. 716/5 |
| 2005/0132306 A1* | | 6/2005 | Smith et al. .................. 716/1 |
| 2005/0188338 A1* | | 8/2005 | Kroyan et al. ................ 716/9 |
| 2005/0204328 A1* | | 9/2005 | Strelkova et al. ............ 716/21 |

(Continued)

FOREIGN PATENT DOCUMENTS

EP 0872883 A2 10/1998

(Continued)

OTHER PUBLICATIONS

Gupta, P. et al. "Manufacturing-Aware Physical Design" IEEE/ACM Int'l Conference on Computer Aided Design, ICCAD 2003, San Jose, CA, Nov. 9-13, 2003, pp. 681-687.

(Continued)

*Primary Examiner* — Paul Dinh
*Assistant Examiner* — Nha Nguyen
(74) *Attorney, Agent, or Firm* — Vista IP Law Group, LLP

(57) ABSTRACT

Methods and systems for allowing an Integrated Circuit designer to specify one or more design rules, and to determine the expected probability of success of the IC design based on the design rules. Probability information is compiled for each circuit component, that specifies the probability of the circuit component working if a characteristic of the circuit component is varied. As the design rules are examined, the probability of each component working is calculated. The probabilities are combined to determine the overall probability of success for the IC design. Furthermore, the IC design may be broken into a plurality of portions, and design rules can be separately specified for each portion. This allows a designer the flexibility to use different design rules on different portions of the IC design.

45 Claims, 7 Drawing Sheets

U.S. PATENT DOCUMENTS

2005/0278663 A1* 12/2005 Kemerer et al. ............... 716/4
2006/0085772 A1* 4/2006 Zhang ............................ 716/4
2008/0320422 A1* 12/2008 Cazeaux ........................ 716/5

FOREIGN PATENT DOCUMENTS

JP 04167537 A 6/1992
WO 2006/024324 A1 3/2006

OTHER PUBLICATIONS

Ferguson, J. "Shifting Methods: Adopting a Design for Manufacture Flow" Proceedings of the 5th Int'l Symposium on Quality Electronic Design, San Jose, CA, Mar. 22-24, 2004, pp. 171-175.

International Search Report and Written Opinion dated Dec. 6, 2006 for PCT/US2006/019305.

* cited by examiner

US 8,103,982 B2

SYSTEM AND METHOD FOR STATISTICAL DESIGN RULE CHECKING

RELATED APPLICATION

The present application claims the benefit of U.S. Provisional Application No. 60/683,438, filed May 20, 2005, the entire disclosure of which is hereby incorporated by reference herein.

FIELD

The invention relates to Integrated Circuit (chip) design, and in particular, to a system and method for altering design rules during chip design.

BACKGROUND

Design rules are used to communicate the limitations of the lithography process to chip designers. Modern design rules consist of strict acceptance/rejection criteria which can be specified for each aspect of a design. For example, typical design criteria might specify that a connection line shall have no less than a specified width or a via shall have no larger than a specified width and length. These design rules are implemented to ensure that both desired electrical characteristics are met and a specific yield is obtained.

For example, due to the lithography process used, interconnect lines may print unacceptably if they are too thin. The smaller the width, the greater the proportion of interconnect lines that will print unacceptably and fail to function as desired. In order to produce functioning chips with an acceptable yield, the manufacturer will specify design rules that govern the design of the chip. Currently, these design rules are "black and white." For example, a design rule might specify that a interconnect line must have a width of at least 100 nm. In this case, a designer may use a interconnect line with any width of at least 100 nm, but not a transmission line with a width of 99 nm or less.

While these design rules are useful to communicate the limitations of the lithography process, they do not provide the designer with enough information to determine how the chip would be affected if a design rule were modified. Since designers are often required to work within strict space limitations, it would be useful for a designer to determine the impact on the overall design and yield if a particular design rule were changed.

For example, the designer may wish to determine how the overall chance of the chip working would be affected if the minimum width for a interconnect line were reduced to 99 nm, or increased to 105 nm. However, at present, the designer does not have the ability either to adjust the design rules, or to determine the affect of adjusting the design rules.

Furthermore, the design rules are specified based only on the lithography process, without taking into account the type of chip being designed. The failure of even one circuit element can cause the entire chip to fail. Thus, for very large chips with a large number of circuit elements, it may be desirable to make the design rules relatively conservative to preserve the yield. However, for smaller chips in which obtaining an acceptable yield is not as difficult, it may be desirable to make the design rules less conservative, for example, to improve the timing or other performance aspects. Other properties of the chip to be designed may similarly affect the design process. For example, timing requirements, power requirements, or other properties may have an effect on the design. It is therefore desirable to allow a chip designer to alter the design rules, and to determine the effect of such alterations.

SUMMARY

Methods and systems for allowing an Integrated Circuit designer to alter one or more design rules, and to determine the expected probability of success of the IC design based on the design rules. Probability information is compiled for each circuit component, that specifies the probability of the circuit component working if a characteristic of the circuit component is varied. As the design rules are changed, the probability of each component working is calculated. The probabilities are combined to determine the overall probability of success for the IC design. Furthermore, the IC design may be broken into a plurality of portions, and design rules can be separately specified for each portion. This allows a designer the flexibility to use different design rules on different portions of the IC design.

In one implementation, a method for IC design includes receiving an IC design containing a circuit component and receiving a first proposed design rule. The method also includes receiving probability information for the circuit component, the probability information specifying probable success of the circuit component working if a characteristic of the circuit component is varied, and determining a probable success of the circuit component working based on the proposed design rule and the probability information.

In another implementation, a method for creating an IC design suitable for manufacture includes receiving an IC design and specifying a first set of design rules. The method also includes determining a first overall probability of success of the IC design working based on the IC design and the first set of design rules, and selecting the first set of design rules to be used in manufacture of the IC design, based on the first overall probability of success.

DETAILED DESCRIPTION

Figure 1:
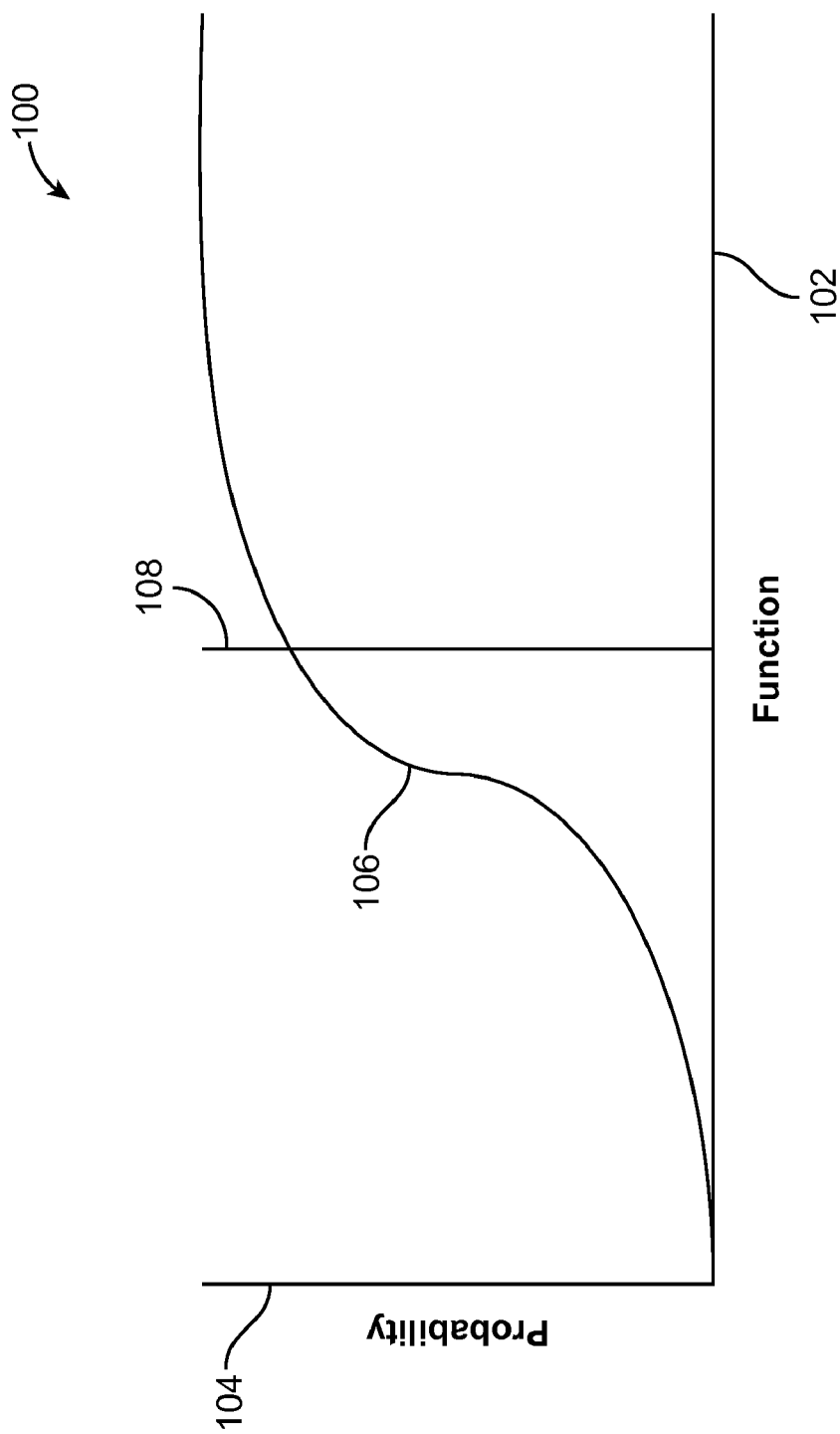
FIG. 1 depicts a probability chart showing probable success of a component working if a characteristic of the component is varied.

FIG. 1 depicts a probability chart 100 showing probable success of a component working if a characteristic of the component is varied. The X axis 102 of the chart can be any characteristic of the component, such as length or width of a transistor. In alternate embodiments, the characteristic can be any physical and/or electrical attribute of the component. In one embodiment, the X axis can have a linear scale. However, in alternate embodiments, any known and/or convenient scale can be used.

The Y axis 104 of the chart indicates the probability that the component will function as desired. In one embodiment, the Y axis can have a linear scale. However, in alternate embodiments, any known and/or convenient scale can be used.

The S-shaped curve 106 represents the plot of the characteristic of the component versus the probability that the component will function as desired. The vertical line 108 represents a design rule for the characteristic which can be typically specified as a cut-off. In alternate embodiments, the vertical cut-off can be located in any convenient position along the X-axis 102.

Figure 1B:
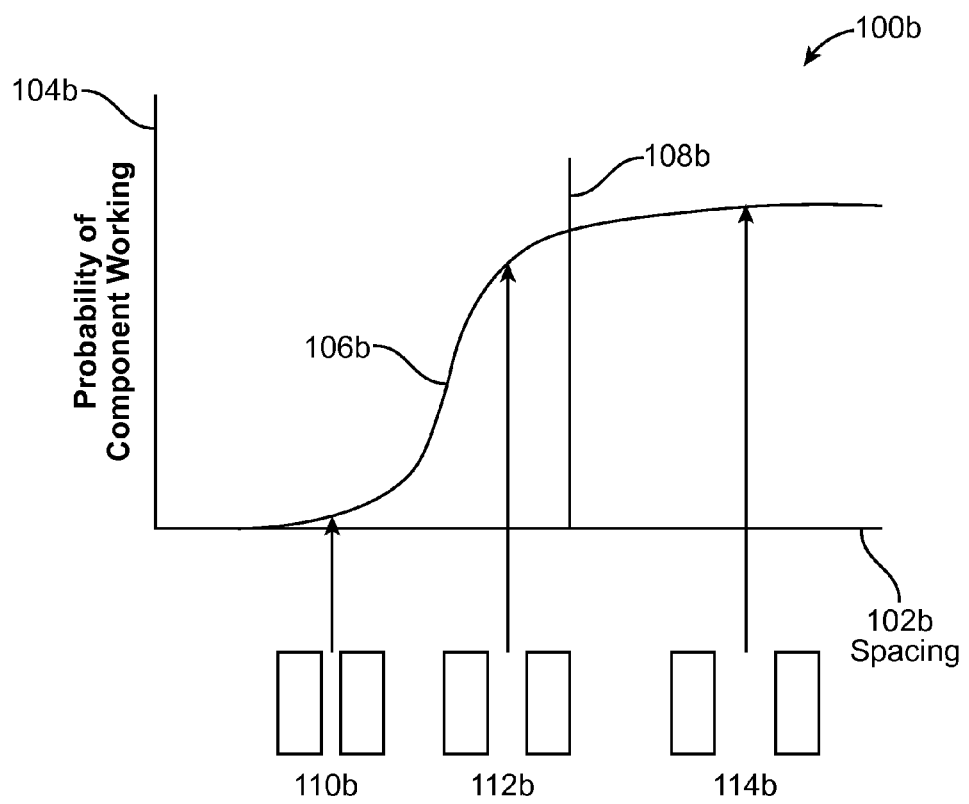
FIG. 1b depicts a probability chart showing probable success of a component working if a characteristic of the component is varied.

FIG. 1b depicts a probability chart showing probable success of a component working if a characteristic of the component is varied. FIG. 1b is an exemplary case of the probability chart of FIG. 1, in which the characteristic that is varied is the minimum spacing requirement. As shown in FIG. 1b, for a first, relatively narrow minimum spacing 110b, the probability of the component working is relatively low. For a second, intermediate minimum spacing 112b, the probability of the component working is higher, and for a third, larger minimum spacing 114b, the probability of the component working is still higher. As the design rule 108b is adjusted to accommodate different minimum spacings (that is, as the design rule 118b is migrated left and right along the x-axis or spacing axis 102b), the intersection of the design rule 108b with the curve 106b changes, indicating the different probabilities of the component working.

As the design rule 108b is changed, the probability of the component working is indicated by the y-value of the intersection of the design rule 108b with the curve 106b. As the design rule 108b is changed, the probability of the component working may be used in conjunction with other probabilities for other components, or other probabilities for other design rules, in order to determine an overall probability for the entire chip working. Methods for combining probabilities will be discussed with reference to FIGS. 2-2c. In particular, general methods for combining probabilities will be discussed with reference to FIG. 2, methods for combining probabilities for various components and for various regions of a chip will be discussed further with reference to FIG. 2b, and methods for combining probabilities for various design rules will be discussed further with reference to FIGS. 2c-2d.

It is noted that, although the invention has been described in terms of calculating a probability of success for each component and a probability of success for the chip overall, other statistical information could be used. For example, rather than specifying a probability of success, the curve 106b could specify some other statistical information, such as a probability of failure, an expected percentage chance of defects, an expected number of defects per thousand or per some other finite number, or any other appropriate statistical information. Furthermore, the information calculated for the component could include a probability of failure, an expected percentage chance of defects, an expected number of defects per thousand or per some other finite number, or any other appropriate statistical information. Likewise, the information calculated for the chip overall could include a probability of failure, an expected percentage chance of defects, an expected number of defects per thousand or per some other finite number, or any other appropriate statistical information.

Figure 2:
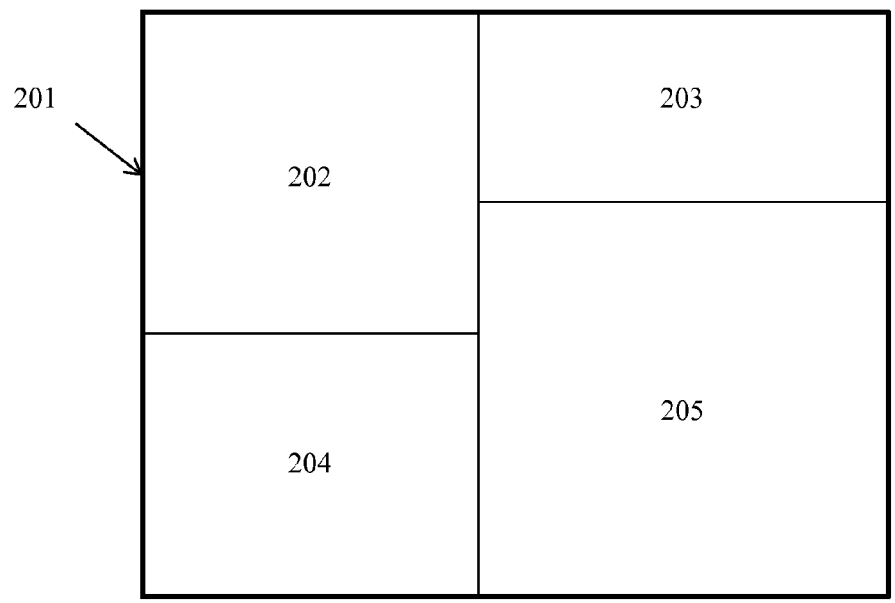
FIG. 2. depicts a probability chart showing probable success of a design working based on combined probabilities of components.

FIG. 2 shows an example chip design 201 having four portions 202, 203, 204, and 205. This figure can be used to illustrate the probable success of an overall design working. In general, the probable success of the overall chip design 201 is related to the combined probabilities of each individual portion 202, 203, 204, and 205 of the chip design. Any known and/or convenient mathematical probabilistic combination method and/or system can be used to combine probabilities. In one embodiment, multiple probabilities from multiple components can be combined, using any known and/or convenient probabilistic combination method or system, to determine a combined probability of success of a system based on the various probabilities of success of each component and/or the overall probabilities of success of each component.

In some embodiment that use probability charts, the X axis of the chart can be configured to be any characteristic of a component, such as length or width of a interconnect line. In alternate embodiments, the characteristic can be any physical and/or electrical attribute of a component. In one embodiment, the X axis can have a linear scale. However, in alternate embodiments, any known and/or convenient scale can be used. The Y axis of the chart can be configured to indicate the probability that the overall design will function as desired. In one embodiment, the Y axis can have a linear scale. However, in alternate embodiments, any known and/or convenient scale can be used.

The probability chart may show a curve, such as an S-shaped curve, that represents the plot of the characteristic of the overall design versus the probability that the overall design will function as desired. A vertical line can be used to represent a design rule which can be specified as a cut-off. In alternate embodiments, the vertical cut-off can be located in any convenient position along the X-axis or Y-axis (specifying a probability of achieving a desired function).

Figure 2B:
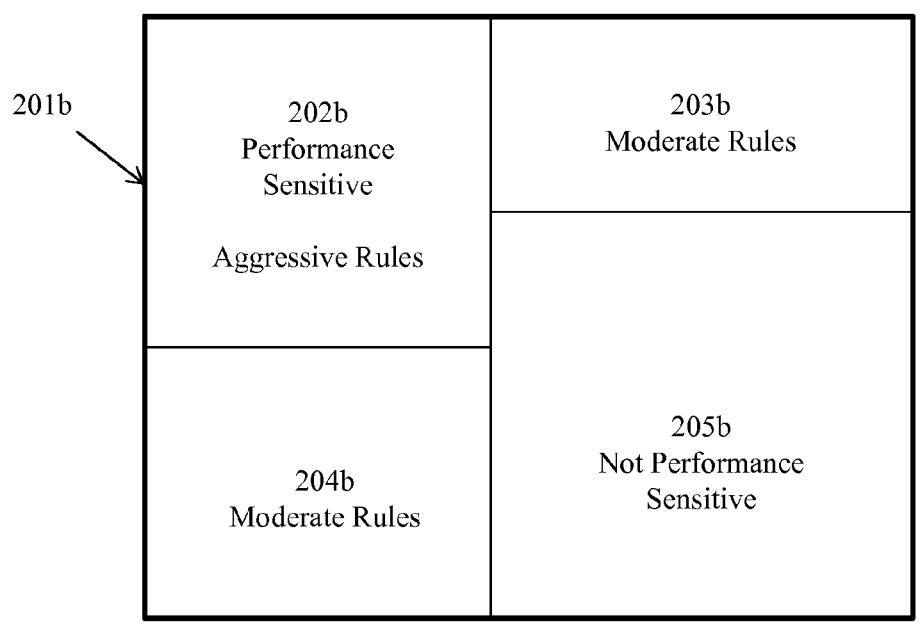
FIG. 2b depicts a probability chart showing probable success of a design working based on combined probabilities of various regions of a chip.

FIG. 2b depicts a probability chart showing probable success of a design working based on combined probabilities of various regions of a chip. As shown in FIG. 2b, an example chip design or portion of a chip design 201b has four portions 202b, 203b, 204b, and 205b. Each of the portions of the chip may have different design requirements. For example, portion 202b may be performance-sensitive, for example, due to strict timing requirements, strict power consumption requirements, or other requirements of the design. Because portion 202b is performance-sensitive, aggressive design rules, such as very narrow spacing requirements, may be used to improve the performance of the portion 202b. In contrast, portion 205b may be less performance-sensitive, and conservative rules may be used in portion 205b. For example, larger minimum spacing requirements may be used in portion 205b. This may improve the probability of the portion 205b working, and thus improve the overall yield of the chip 201b. Portions 203b and 204b may be somewhat performance-sensitive, and moderate rules may be used in these portions.

During the design process, a designer may identify the portions 202b, 203b, 204b, 205b, and may also identify whether each portion is performance-sensitive. The designer may then specify potential design rules in each of the portions 202b, 203b, 204b, 205b, and determine the overall success of the chip working based on the modified design rules. For example, the designer may create more aggressive rules for portion 202b, and may create more conservative rules for portion 205b. Based on the modified rules for each portion, the probable success of the overall chip design 201 may be calculated and presented to the designer. The designer may specify one or more rules one or more times, in order to find a set of design rules that result in an improved or optimal probability of the overall design working.

Each portion of the design may in itself contain various sub-portions with various requirements, and thus, the process of specifying design rules may be repeated for each of the sub-portions, until a sufficient level of granularity is achieved.

In some cases, the process may be repeated until specific design rules are specified for each circuit component. For example, portion 202b has been designated as a performance sensitive block where aggressive rules are selected. Portion 202b may, however, be a large block including critical and non-critical circuits. In this case, portion 202b may be divided into sub-portions, some of which will have aggressive rules, and others with conservative rules. These sub-portions may further be divided based on differing requirements. The process may be continued, in some cases, up to the individual component level, in which only the components in the critical path or paths have aggressive design rules.

The probability of the overall design working is related to the combined probabilities of each individual portion 202, 203, 204, and 205 of the chip design. Any known and/or convenient mathematical probabilistic combination method and/or system can be used to combine probabilities. In one embodiment, multiple probabilities from multiple components can be combined, using any known and/or convenient probabilistic combination method or system, to determine a combined probability of success of a system based on the various probabilities of success of each component and/or the overall probabilities of success of each component.

In some cases, the probabilities of various portions of the chip working may be related, while in other cases, the probabilities of various portions of the chip working may be independent. In the case where the probability of each portion of the chip working is independent, the probabilities for each portion may be multiplied to obtain the overall chance of the chip working, or combined in some other appropriate fashion. However, if the probabilities for the portions of the chip working are related, statistics may be taken to obtain an appropriate formula to combine the probabilities.

For example, it may be determined that, because the portion 202b has the most aggressive design rules in the chip, that if the portion 202b functions properly, then the other portions of the chip are certain or nearly certain to function properly. In this case, the probability of the chip working is equivalent or nearly equivalent to the probability of the portion 202b functioning properly. Other examples in which the probabilities of the various portions are related will occur to those skilled in the art.

Figure 2C:
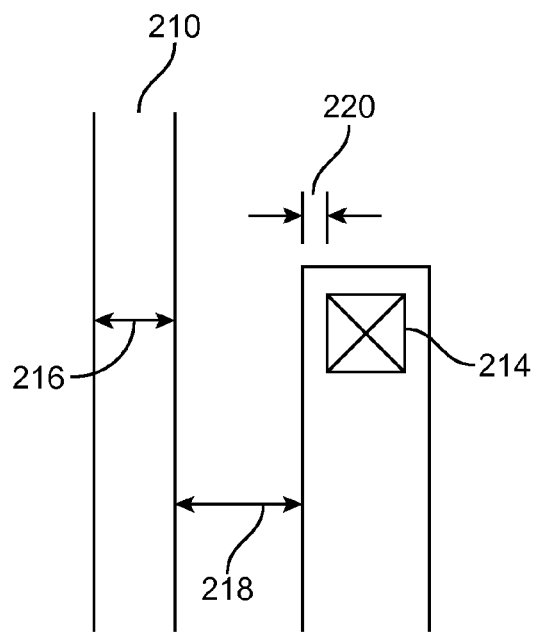
FIGS. 2c-2d depict possible layouts based on variations in design rules.
Figure 2D:
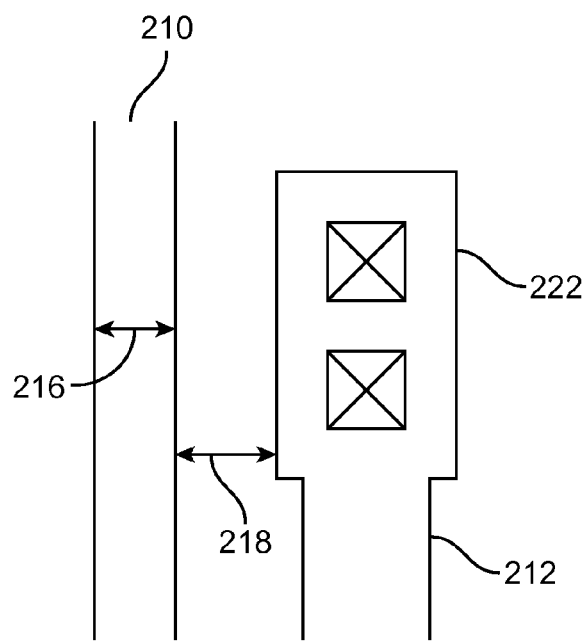

FIGS. 2c-2d depict possible layouts based on variations in design rules. As shown in FIGS. 2c-2d, various rules may be specified for the a chip or portion of a chip. In the example shown in FIGS. 2c-2d, a chip may contain a interconnect line 210 and a via 214. The design rules that are examined in this example are minimum interconnect line width 216, minimum spacing 218, minimum via overlap 220, and number of vias 214. As shown in FIG. 2c, a tradeoff may be required between the width of the interconnect line 216, the minimum spacing 218, and the minimum via overlap 220. Furthermore, in some cases, two or more rules may conflict, as when the geometry of the chip does not allow the rules for the minimum interconnect line width 216, minimum spacing 218, minimum via overlap 220, to all be observed.

In creating a design, a designer may wish to determine the chances of the chip working if the interconnect line width 216 is increased at the expense of the minimum spacing 218 and/or the minimum via overlap 220; or if the minimum spacing 218 is increased at the expense of the interconnect line width 216 and/or the minimum via overlap 220; or if the minimum via overlap 220 is increased at the expense of the interconnect line width 216 and/or the minimum spacing 218. Furthermore, the designer may wish to determine the chances of the chip working of the number of vias 214 is increased at the expense of one or more of the other parameters, as shown in FIG. 2d.

In order to determine the chances of the chip working based on different geometries, the designer may specify one or more design rules. The chances of each component working based on the specified design rules will then be computed, and the overall chance of the chip working will be calculated. If the overall chance of the chip working is unacceptable, the designer may alter the design rules, or may specify new design rules.

In order to determine the chances of each component working, statistical information may be provided. For example, a fabrication laboratory may compile statistical information based on the chip designs that have recently been fabricated. Alternatively or in addition, test chips could be fabricated to determine the effect of various design rules on the probability of each component working. The statistical information that is provided may be in the form of a probability curve, as discussed previously with reference to FIG. 2.

Figure 3:
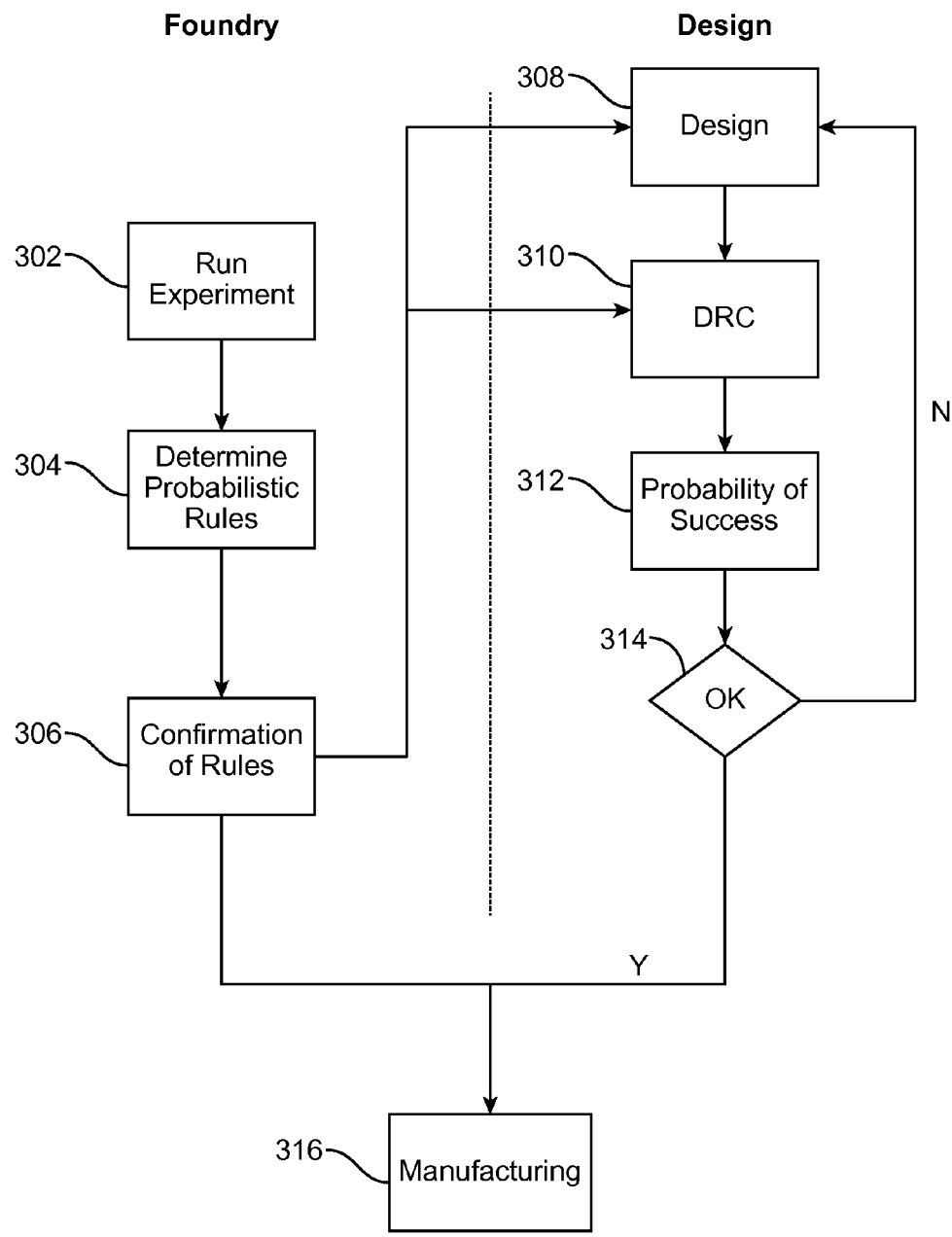
FIG. 3 depicts a flow diagram of a method for statistical design rule checking.

FIG. 3. depicts a flow diagram of a method for statistical design rule checking. In step 302, the foundry, or any other convenient entity, can run experiments and determine results based on variation of various characteristics of components. The experiments can be run in any known and/or convenient manner that provides data regarding the characteristics and the operability and/or functioning of a component. In some embodiments, the experiments can be computer simulations, theoretical experimentations, physical experiments and/or any combination thereof.

In step 304, the results for the experiments run in step 302 can be combined to create probabilistic rules for each component, such as the S-Shaped curve 106 shown in FIG. 1. However, in alternate embodiments, the probabilistic rules need not be produced in a chart format and can be produced in any known and/or convenient format and can contain any convenient information.

In step 306, the probabilistic rules can be confirmed. Confirmation of the rules can include verification that the prescribed limitations are within the scope of the manufacturing equipment and/or verification of any other attribute and/or system limitation. For example, tests can be run on customer chips or test chips, to determine whether the probabilistic rules are accurate. In some embodiments, the confirmation step 306 can be skipped.

In some embodiments, the probabilistic rules can be transmitted to the design step 308 and can be used in the design process. In alternate embodiments, the probabilistic rules can be transmitted to the design rule check step 310. During design rule check step 310, the design from step 308 can be checked against the probabilistic rules to determine a probability of achieving a desired function for each component and/or any selection of components. In still further alternate embodiments, the confirmed probabilistic rules can be transmitted to both the design step 308 and the design rule check step 310 and used during both steps.

In step 312, the overall probability of success for the design can be evaluated. The overall probability of success can be determined using any statistical combination method based on the design step 308, the design rule check step 310 and the probabilistic rules determined in step 304. In some embodiments, the probability of success can be determined based on an evaluation of the statistical combination of the probabilities of all components of the design. However, in alternate embodiment, the probability of success can be determined based on an evaluation of the statistical combination of the probabilities of a predefined or randomly selected group of components of the design. In some embodiments, the probabilities can be based on individual components as shown in FIG. 1 or can be based on aggregate probabilities, as shown in FIG. 2 or any convenient combination thereof.

In step 314, the probability of success is compared with the predetermined minimal probability of success. If the determined probability of success falls below the predetermined minimal probability of success, then the system can return to step 308 and design modifications can be made. If in probability of success meets and/or exceeds the predetermined minimal probability of success, then manufacture of the design can proceed in step 316. Manufacture of the design can be accomplished using any known and/or convenient system or method. Based on the results of the manufacture 316, further statistics or other information can be generated, and the statistics or other information generated can be used to determine further probabilistic rules in step 304, or to confirm the rules 306.

Many modifications to the invention are contemplated. In particular, while the invention has been described in terms of selecting design rules for a chip or portion of a chip based on statistical information, the statistical information itself could be considered to be a statistical design rule, and the statistical design rule could be used to guide the design of the invention. For example, each S-shaped curve or other statistical information may be considered to be a statistical design rule. In this case, the statistical design rules may be considered to be unchanged throughout the design process and throughout the portions of the chip. Each portion of the chip, or each individual component, will be designed according to the statistical design rule specified by the S-shaped curve or other statistical information, in order to obtain the desired functionality.

In some embodiments, the chance of succeeding, failing or other characteristics of adequacy, suitability or acceptance, may be determined by specific patterns specified by the user. An example approach for using patterns in this manner is described in U.S. application Ser. No. 11/437,320, entitled METHOD AND SYSTEM FOR INCORPORATION OF PATTERNS AND DESIGN RULE CHECKING, filed on May 19, 2006, the complete contents of which are incorporated herein by reference in its entirety. When such a specific case is found, the characteristic may be taken from the specific pattern, and not derived from the rules as described above. This allows the user to correctly account for specific geometrical configurations, which are known from experience not to be accurately predicted from the rules alone.

Furthermore, in some embodiments, statistical design rule checking can be used in conjunction with a method or system for using DFM aware cells. An example approach for using DFM aware cells is described in U.S. Provisional Patent Application Ser. No. 60/704,192, entitled "Method and Mechanism for Implementing DFM Intelligent Cells for an Electronic Design", filed on Jul. 28, 2005, which is incorporated herein by reference in its entirety.

Figure 4:
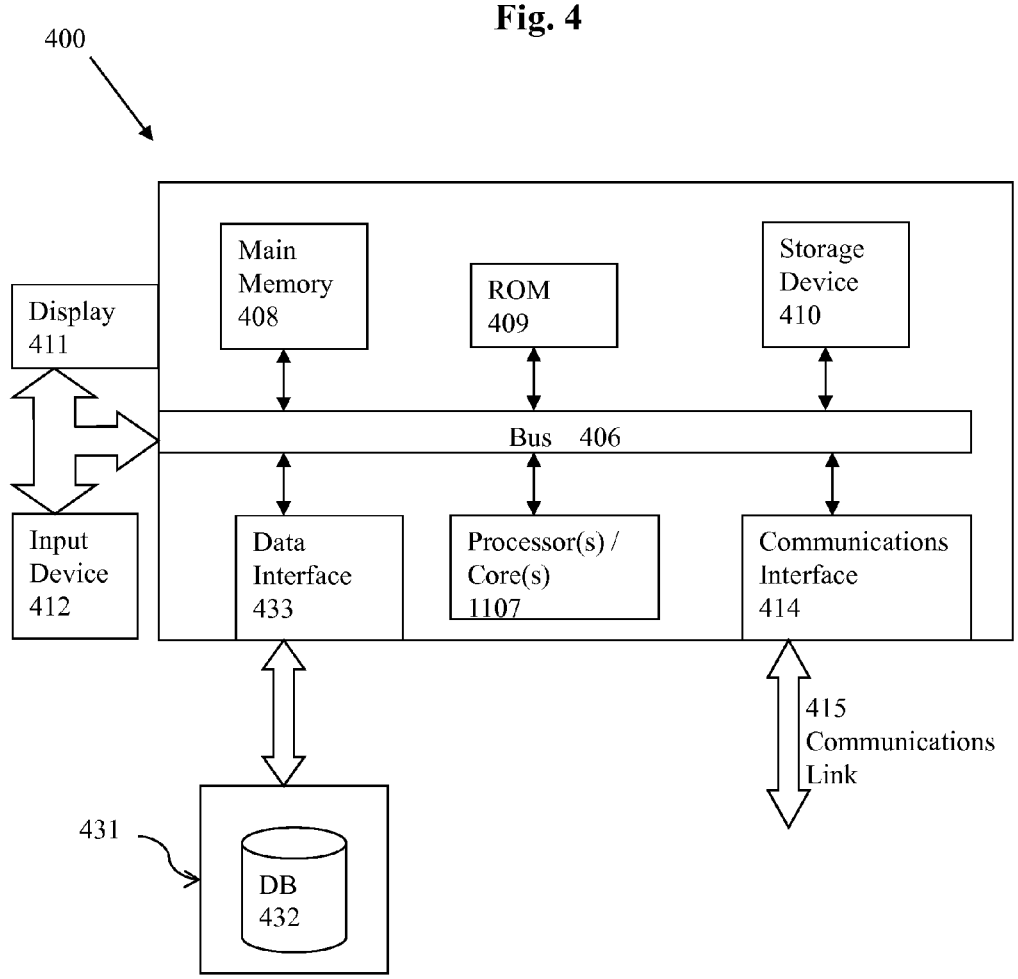
FIG. 4 depicts a computerized system on which a method for statistical design rule checking can be implemented.

The execution of the sequences of instructions required to practice the embodiments may be performed by a computer system 400 as shown in FIG. 4. In an embodiment, execution of the sequences of instructions is performed by a single computer system 400. According to other embodiments, two or more computer systems 400 coupled by a communication link 415 may perform the sequence of instructions in coordination with one another. Although a description of only one computer system 400 will be presented below, however, it should be understood that any number of computer systems 400 may be employed to practice the embodiments.

A computer system 400 according to an embodiment will now be described with reference to FIG. 4, which is a block diagram of the functional components of a computer system 400. As used herein, the term computer system 400 is broadly used to describe any computing device that can store and independently run one or more programs.

Each computer system 400 may include a communication interface 414 coupled to the bus 406. The communication interface 414 provides two-way communication between computer systems 400. The communication interface 414 of a respective computer system 400 transmits and receives electrical, electromagnetic or optical signals, that include data streams representing various types of signal information, e.g., instructions, messages and data. A communication link 415 links one computer system 400 with another computer system 400. For example, the communication link 415 may be a LAN, in which case the communication interface 414 may be a LAN card, or the communication link 415 may be a PSTN, in which case the communication interface 414 may be an integrated services digital network (ISDN) card or a modem, or the communication link 415 may be the Internet, in which case the communication interface 414 may be a dial-up, cable or wireless modem.

A computer system 400 may transmit and receive messages, data, and instructions, including program, i.e., application, code, through its respective communication link 415 and communication interface 414. Received program code may be executed by the respective processor(s) 407 as it is received, and/or stored in the storage device 410, or other associated non-volatile media, for later execution.

In an embodiment, the computer system 400 operates in conjunction with a data storage system 431, e.g., a data storage system 431 that contains a database 432 that is readily accessible by the computer system 400. The computer system 400 communicates with the data storage system 431 through a data interface 433. A data interface 433, which is coupled to the bus 406, transmits and receives electrical, electromagnetic or optical signals, that include data streams representing various types of signal information, e.g., instructions, messages and data. In embodiments, the functions of the data interface 433 may be performed by the communication interface 414.

Computer system 400 includes a bus 406 or other communication mechanism for communicating instructions, messages and data, collectively, information, and one or more processors 407 coupled with the bus 406 for processing information. Computer system 400 also includes a main memory 408, such as a random access memory (RAM) or other dynamic storage device, coupled to the bus 406 for storing dynamic data and instructions to be executed by the processor(s) 407. The main memory 408 also may be used for storing temporary data, i.e., variables, or other intermediate information during execution of instructions by the processor(s) 407.

The computer system 400 may further include a read only memory (ROM) 409 or other static storage device coupled to the bus 406 for storing static data and instructions for the processor(s) 407. A storage device 410, such as a magnetic disk or optical disk, may also be provided and coupled to the bus 406 for storing data and instructions for the processor(s) 407.

A computer system 400 may be coupled via the bus 406 to a display device 411, such as, but not limited to, a cathode ray tube (CRT), for displaying information to a user. An input device 412, e.g., alphanumeric and other keys, is coupled to the bus 406 for communicating information and command selections to the processor(s) 407.

According to one embodiment, an individual computer system 400 performs specific operations by their respective processor(s) 407 executing one or more sequences of one or more instructions contained in the main memory 408. Such instructions may be read into the main memory 408 from another computer-usable medium, such as the ROM 409 or the storage device 410. Execution of the sequences of instructions contained in the main memory 408 causes the processor(s) 407 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 407. Such a medium may take many forms, including, but not limited to, non-volatile, volatile and transmission media. Non-volatile media, i.e., media that can retain information in the absence of power, includes the ROM 409, CD ROM, magnetic tape, and magnetic discs. Volatile media, i.e., media that can not retain information in the absence of power, includes the main memory 408. Transmission media includes coaxial cables, copper wire and fiber optics, including the wires that comprise the bus 406. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A computer implemented method for designing an integrated circuit (IC), comprising:
    using a computer system that comprises at least one processor and is configured for performing at least a process for:
    identifying an integrated circuit (IC) design for the integrated circuit;
    identifying a goal for at least a portion of the integrated circuit design, wherein the at least a portion of the integrated circuit design comprises a plurality of circuit components;
    identifying a first probability information for each of at least some of the plurality of circuit components, the first probability information specifying a relationship between statistical information for the each of the at least some of the plurality of circuit components and a design rule for the at least the portion of the integrated circuit design,
    wherein the first probability information represents a first probability of success for the each of the at least some of the plurality of circuit components, and
    the statistical information varies in accordance with the design rule as specified by the relationship;
    determining a second probability information for the at least the portion of the integrated circuit design by compiling at least the first probability information for the each of the at least some of the plurality of circuit components, wherein the second probability information represents a second probability of success for the at least the portion of the integrated circuit design; and
    adjusting how the design rule is applied to the at least the portion of the integrated circuit design to meet the goal by using at least the relationship to identify a value or a range of values of a characteristic of a component for an application of the design rule.

2. The computer implemented method of claim 1, wherein the characteristic comprises a geometrical dimension of the circuit element.

3. The computer implemented method of claim 2, wherein the geometrical dimension comprises a width of the circuit element.

4. The computer implemented method of claim 2, wherein the geometrical dimension comprises an area of the circuit element.

5. The computer implemented method of claim 1, wherein the characteristic comprises a spacing dimension affecting operation of the circuit element.

6. The computer implemented method of claim 1, wherein the goal comprises maximizing a yield.

7. The computer implemented method of claim 1, wherein the goal comprises achieving at least a predetermined minimum yield.

8. The computer implemented method of claim 1, wherein the statistical information describes probable success for the at least some of the plurality of circuit components working as a function of the characteristic of the at least some of the plurality of circuit components.

9. The computer implemented method of claim 1, wherein the statistical information describes probable failure for the at least some of the plurality of circuit components working as a function of the characteristic of the first circuit component.

10. The computer implemented method of claim 1, wherein the value or range of values for the characteristic of the at least some of the plurality of circuit components comprises a design rule for the integrated circuit design.

11. The computer implemented method of claim 1, further comprising:
    calculating overall statistical information for the integrated circuit design based at least in part on the statistical information for the at least some of the plurality of circuit components working.

12. The computer implemented method of claim 11, wherein the overall statistical information for the integrated circuit design is based at least in part on the statistical information for a plurality of portions of the integrated circuit design.

13. The computer implemented method of claim 12, wherein the overall statistical information for the integrated circuit design is based at least in part on a combination of the statistical information for the plurality of portions of the integrated circuit design.

14. The computer implemented method of claim 11, wherein the integrated circuit design comprises a first circuit component, and wherein the overall statistical information for the integrated circuit design is based at least in part on second statistical information for a second circuit component of the plurality of circuit components.

15. The computer implemented method of claim 11, wherein the overall statistical information describes probable success for the circuit working as a function of the characteristic of the at least some of the plurality of circuit components.

16. The computer implemented method of claim 11, wherein the overall statistical information describes probable failure for the circuit working as a function of the characteristic of the at least some of the plurality of circuit components.

17. The computer implemented method of claim 1, in which the act of designing the integrated circuit comprises generating a physical design for the portion of the integrated circuit design.

18. The computer implemented method of claim 1, further comprising:
adjusting the design rule by identifying a value or a range of values for the characteristic for designing the at least some of the plurality of circuit components in the portion of the integrated circuit design.

19. The computer implemented method of claim 1, in which the characteristic comprises a physical or an electrical attribute of the at least some of the plurality of circuit components.

20. The computer implemented method of claim 1, further comprising:
selecting the design rule based at least in part on the value or range of values selected for the characteristic of the at least some of the plurality of circuit components in the integrated circuit design.

21. The computer implemented method of claim 1, further comprising:
adjusting the design rule to improve the at least the portion of the integrated circuit design to meet the goal by using at least the relationship to identify the value or the range of values for the characteristic of the component in the design rule for designing the at least some of the plurality of circuit components in the at least the portion of the integrated circuit design.

22. A computer implemented method for improving fabrication of an integrated circuit (IC), comprising:
using a computer system configured for performing:
identifying an integrated circuit design;
identifying a first set of design rules for the integrated circuit design, wherein the first set of design rules comprise a design rule;
identifying a goal for a portion of a plurality of portions in the integrated circuit design;
identifying first probability information for each of at least some of the plurality of circuit components in the portion of the plurality of portions, the first probability information specifying a relationship between statistical information for the at least some of the plurality of circuit components and the design rule for the portion in the integrated circuit design, wherein
the first probability information representing a first probability of success for the each of the at least some of the plurality of circuit components, and
the statistical information varies in accordance with the design rule as specified by the relation;
determining a second probability information representing a second probability of success for the portion of the integrated circuit design by compiling at least the first probability information for the each of the at least some of the plurality of circuit components;
using the received statistical information to perform design rule checking, wherein a first overall statistical information is determined for the integrated circuit design for at least two portions of the plurality of portions or at least two components of the integrated circuit design and is checked against the goal;
selecting the design rule to be used for manufacture the integrated circuit design and adjusting how the design rule is applied to at least the portion of the integrated circuit design to meet the goal by using at least the relationship to identify a value or a range of values of a characteristic of a component for an application of the design rule, based at least in part on the first overall statistical information meeting the goal.

23. The computer implemented method of claim 22, wherein the design rules specify a geometrical dimension of a circuit element in the IC design.

24. The computer implemented method of claim 23, wherein the geometrical dimension comprises a width of the circuit element.

25. The computer implemented method of claim 23, wherein the geometrical dimension comprises an area of the circuit element.

26. The computer implemented method of claim 22, wherein at least one of the design rule specifies a spacing dimension of the IC design.

27. The computer implemented method of claim 22, wherein the first overall statistical information comprises a probability of success for the integrated circuit design.

28. The computer implemented method of claim 22, wherein the first overall statistical information comprises a probability of failure for the integrated circuit design.

29. The computer implemented method of claim 22, wherein the first overall statistical information indicates that a predetermined yield threshold will be met in the manufacture of the integrated circuit design.

30. The computer implemented method of claim 22, wherein the first overall statistical information indicates that a yield will be maximized in the manufacture of the integrated circuit design.

31. The computer implemented method of claim 22, further comprising:
specifying a second set of design rules;
determining a second overall statistical information for the integrated circuit design based at least in part on the integrated circuit design and the second set of design rules; and
determining that the second set of design rules will not be used in manufacture of the integrated circuit design.

32. The computer implemented method of claim 31, wherein the second overall statistical information indicates that a predetermined yield threshold will not be met in the manufacture of the integrated circuit design.

33. The computer implemented method of claim 22, wherein the integrated circuit design comprises with the plurality of portions, and the first set of design rules comprises a subset of design rules for each of the plurality of portions.

34. The computer implemented method of claim 33, wherein the first overall statistical information is based at least in part on a combination of statistical information for the plurality of portions of the integrated circuit design.

35. The computer implemented method of claim 22, wherein the first overall statistical information is based at least in part on first statistical information for the second plurality of circuit components.

36. The computer implemented method of claim 22, further comprising:
specifying a second set of design rules;
determining a second overall statistical information for the integrated circuit design based at least in part on the integrated circuit design and the second set of design rules; and determining that the second set of design rules to be used for manufacturing the integrated circuit design instead of the first set of design rules.

37. The computer implemented method of claim 22, further comprising:
adjusting the design rule to improve at least the portion of the integrated circuit design by using at least the relationship to identify the value or the range of values for the characteristic of the component in the design rule for designing the at least some of the plurality of circuit components in the at least the portion of the integrated circuit design.

38. A system for designing an Integrated Circuit (IC), comprising:
a computer system that comprises at least one processor and is configured for performing:
identifying an integrated circuit design comprising a plurality of circuit components of the integrated circuit design;
identifying a goal for at least a portion of the integrated circuit design;
identifying first probability information for each of at least some of the plurality of components, the first probability information specifying a relationship between statistical information for the each of the at least some of the plurality of circuit components and a design rule for the at least the portion of the integrated circuit design, wherein
the first probability information representing a first probability of success for the each of the at least some of the plurality of components, and
the statistical information varies in accordance with the design rule as specified by the relationship;
determining a second probability information representing a second probability of success for the at least the portion of the integrated circuit design by compiling at least the first probability information for the each of the at least some of the plurality of circuit components; and
adjusting how the design rule is applied to the at least the portion of the integrated circuit design to meet the goal by using at least the relationship to identify a value or a range of values of a characteristic of a component for an application of the design rule.

39. The system of claim 38, the computer system is further configured for:
adjusting the design rule to improve the at least the portion of the integrated circuit design to meet the goal by using at least the relationship to identify the value or the range of values for the characteristic of the component in the design rule for designing the at least some of the plurality of circuit components in the at least the portion of the integrated circuit design.

40. A computer program module embodied in a non-transitory computer readable storage medium having a sequence of instructions which, when executed by a computer system, causes the computer system to perform a process for improving fabrication of an integrated circuit (IC), the process comprising:
identifying an integrated circuit design for the integrated circuit comprising a plurality of circuit components of the integrated circuit;
identifying a goal for at least a portion of the integrated circuit design;
identifying first probability information for each of at least some of the plurality of components, the first probability information specifying a relationship between statistical information for the each of the at least some of the plurality of circuit components and a design rule for the at least the portion of the integrated circuit design, wherein
the first probability information representing a first probability of success for the each of the at least some of the plurality of circuit components, and
the statistical information varies in accordance with the design rule as specified by the relationship;
determining a second probability information for the at least the portion of the integrated circuit design by compiling at least the first probability information for the each of the at least some of the plurality of circuit components, wherein the second probability information representing the second probability of success for the at least the portion of the integrated circuit design; and
adjusting how the design rule is applied to the at least the portion of the integrated circuit design to meet the goal by using at least the relationship to identify a value or a range of values of a characteristic of a component for an application of the design rule.

41. The computer program product of claim 40, the process further comprising:
adjusting the design rule to improve the at least the portion of the integrated circuit design to meet the goal by using at least the relationship to identify the value or the range of values for the characteristic of the component in the design rule for designing the at least some of the plurality of circuit components in the at least the portion of the integrated circuit design.

42. A system for designing an Integrated Circuit (IC) suitable for manufacture, comprising:
a computer system which comprises at least one processor and a display apparatus and is configured for performing:
identifying an integrated circuit design comprising a plurality of circuit components of an integrated circuit design;
identifying a first set of design rules for the integrated circuit design, wherein the first set of design rules comprise a design rule;
identifying a goal for a portion of a plurality of portions in the integrated circuit design;
identifying first probability information for each of at least some of the plurality of circuit components in the portion, the first probability information specifying a relationship between statistical information for the at least some of the plurality of circuit components and the design rule for the portion of the integrated circuit design, wherein
the first probability information representing a first probability of success for the each of the at least some of the plurality of circuit components, and
the statistical information varies in accordance with the design rule as specified by the relationship;
determining a second probability information representing a second probability of success for the portion of the integrated circuit design by compiling at least the first probability information for the each of the at least some of the plurality of circuit components;
using the statistical information to perform design rule checking wherein a first overall statistical information for the integrated circuit design is determined for at least two of the plurality of portions or at least two components of the integrated circuit design and is checked against the goal; and
selecting the design rule to be used for manufacturing the integrated circuit design and adjusting how the design rule is applied to at least the portion of the integrated circuit design to meet the goal by using at least the relationship to identify a value or a range of values of a characteristic of a component for an application of the design rule, based at least in part on the first overall statistical information meeting the goal.

43. The system of claim 42, the computer system is further configured for:
adjusting the design rule to improve at least the portion of the integrated circuit design by using at least the relationship to identify the value or the range of values for the characteristic of the component in the design rule for designing the at least some of the plurality of circuit components in the at least the portion of the integrated circuit design.

44. A computer program module embodied in a non-transitory computer readable storage medium having a sequence of instructions stored thereupon which, when executed by at least one computer processor, causes the at least one computer processor to execute a process for improving fabrication of an integrated circuit (IC), the process comprising:
using a computer system configured for performing:
identifying an integrated circuit design comprising a plurality of circuit components of the integrated circuit design;
identifying a first set of design rules for the integrated circuit design, wherein the first set of design rules comprise a design rule;
identifying a goal for a portion of a plurality of portions in the integrated circuit design;
identifying first probability information for each of at least some of the plurality of the circuit components in the portion, the first probability information specifying a relationship between statistical information for the at least some of the plurality of circuit components and the design rule for the portion of the integrated circuit design, wherein the first probability information representing a first probability of success for the each of the at least some of the plurality of circuit components, and
the statistical information varies in accordance with the design rule as specified by the relationship;
determining a second probability information for the portion of the integrated circuit design by compiling at least the first probability information for each of the at least some of the plurality of the circuit components, wherein
the second probability information representing a second probability of success for the portion of the integrated circuit design;
using the statistical information to perform design rule checking wherein a first overall statistical information for the integrated circuit design is determined for at least two of the plurality of portions or at least two components of the integrated circuit design and is checked against the goal; and
selecting the design rule to be used for manufacturing the integrated circuit design and adjusting how the design rule is applied to at least the portion of the integrated circuit design to meet the goal by using at least the relationship to identify a value or a range of values of a characteristic of a component for an application of the design rule, based at least in part on the first overall statistical information meeting the goal.

45. The computer program module of claim 44, the process further comprising:
adjusting the design rule to improve at least the portion of the integrated circuit design by using at least the relationship to identify the value or the range of values for the characteristic of the component in the design rule for designing the at least some of the plurality of circuit components in the at least the portion of the integrated circuit design.

* * * * *